United States Patent
Khuat Duy et al.

(10) Patent No.: US 8,570,487 B2
(45) Date of Patent: Oct. 29, 2013

(54) LITHOGRAPHIC APPARATUS, DEVICE MANUFACTURING METHOD, AND METHOD OF APPLYING A PATTERN TO A SUBSTRATE

(75) Inventors: Laurent Khuat Duy, Eindhoven (NL); Noud Jan Gilissen, 's-Gravenzande (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/207,123

(22) Filed: Aug. 10, 2011

(65) Prior Publication Data

US 2012/0058434 A1 Mar. 8, 2012

Related U.S. Application Data

(60) Provisional application No. 61/380,968, filed on Sep. 8, 2010, provisional application No. 61/380,974, filed on Sep. 8, 2010.

(51) Int. Cl.
*G03B 27/42* (2006.01)
*G03B 27/54* (2006.01)

(52) U.S. Cl.
USPC ................................. 355/53; 355/67

(58) Field of Classification Search
USPC ................... 355/52, 53, 55, 67; 356/399–401; 250/548
See application file for complete search history.

(56) References Cited

U.S. PATENT DOCUMENTS

| | | | |
|---|---|---|---|
| 5,525,808 A * | 6/1996 | Irie et al. | ........................ 250/548 |
| 6,469,793 B1 | 10/2002 | Stanton | |
| 6,507,388 B2 | 1/2003 | Burghoorn | |
| 6,809,827 B2 | 10/2004 | Kreuzer | |
| 6,919,561 B2 | 7/2005 | Lee et al. | |
| 8,054,472 B2 * | 11/2011 | Shibazaki | ..................... 356/620 |

(Continued)

FOREIGN PATENT DOCUMENTS

| | | |
|---|---|---|
| JP | 60-186845 | 9/1985 |
| JP | 62-089328 | 4/1987 |

(Continued)

OTHER PUBLICATIONS

Korean Office Action mailed Dec. 20, 2012 in corresponding Korean Patent Application No. 10-2011-0091516.

(Continued)

*Primary Examiner* — Hung Henry Nguyen
(74) *Attorney, Agent, or Firm* — Pillsbury Winthrop Shaw Pittman LLP

(57) ABSTRACT

A lithographic apparatus is arranged to transfer a pattern from a patterning device onto a substrate, in which a measuring subsystem includes one or (preferably) more alignment & level sensors (AS, LS) directed at the substrate near a patterning location of a patterning subsystem. The alignment sensor(s) is operable to recognize and measure alignment marks (P1) on the substrate passing by the sensor during relative motion of the substrate and patterning subsystem under control of the positioning subsystem. A processor combines measurements of relative locations of a plurality of said marks to provide measurement results with an accuracy sufficient for the positioning subsystem to position at least a first substrate portion at said patterning location relative to said alignment marks. A preliminary step obtains position relative to a known pattern (M1) on the patterning device. Measurements are taken and updated in real time during exposure of successive substrate portions.

16 Claims, 11 Drawing Sheets

(56) References Cited

U.S. PATENT DOCUMENTS

| | | | |
|---|---|---|---|
| 8,139,219 B2 * | 3/2012 | George | 356/401 |
| 8,305,555 B2 * | 11/2012 | Koga et al. | 355/53 |
| 2001/0006413 A1 | 7/2001 | Burghoorn | |
| 2004/0066518 A1 | 4/2004 | Kreuzer | |

FOREIGN PATENT DOCUMENTS

| JP | 09-306801 | 11/1997 |
|---|---|---|
| JP | 10-022218 | 1/1998 |
| JP | 10-050600 | 2/1998 |
| JP | 2001-077012 | 3/2001 |
| JP | 2004-014758 | 1/2004 |
| JP | 2008-300880 | 12/2008 |
| KR | 2001-0070326 | 7/2001 |
| KR | 2003-0095331 | 12/2003 |

OTHER PUBLICATIONS

Japanese Office Action mailed Jan. 22, 2013 in corresponding Japanese Patent Application No. 2011-192368.
U.S. Notice of Allowance dated Aug. 13, 2013 in corresponding U.S. Appl. No. 13/207,097.

* cited by examiner

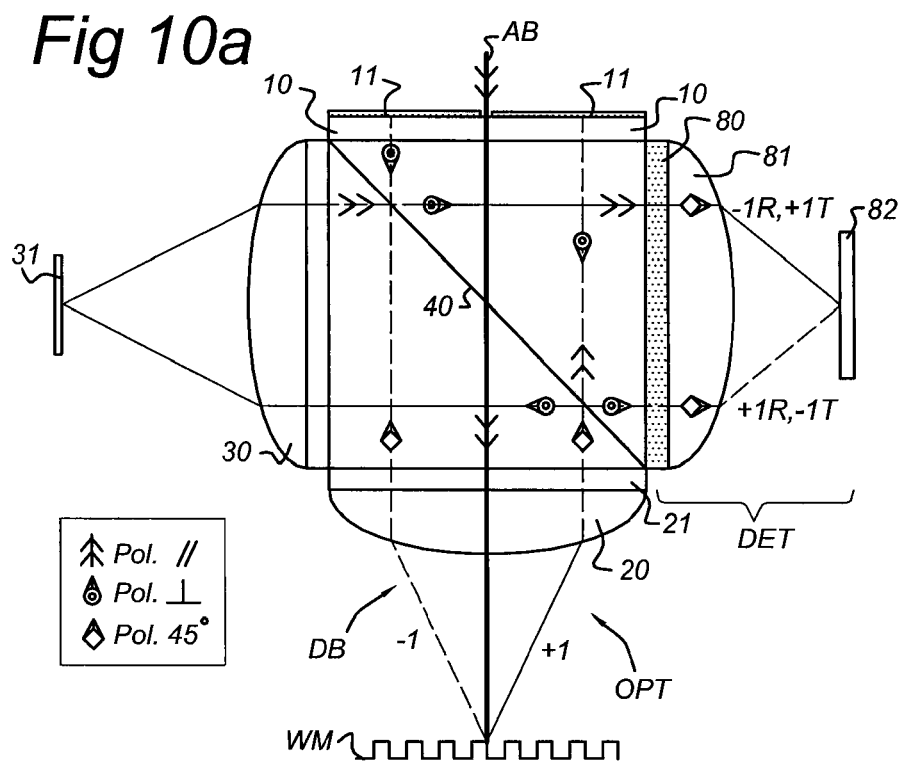

LITHOGRAPHIC APPARATUS, DEVICE MANUFACTURING METHOD, AND METHOD OF APPLYING A PATTERN TO A SUBSTRATE

CROSS-REFERENCE TO RELATED APPLICATION

This application claims priority and benefit under 35 U.S.C. §119(e) to U.S. Provisional Patent Application No. 61/380,974, entitled "Lithographic Apparatus, Device Manufacturing Method, and Method Of Applying A Pattern To A Substrate," filed on Sep. 8, 2010, and to U.S. Provisional Patent Application No. 61/380,968, entitled "Self-Referencing Interferometer, Alignment System, and Lithographic Apparatus," filed on Sep. 8, 2010. The contents of those applications are incorporated herein in their entirety by reference.

FIELD

The present invention relates to a lithographic apparatus and a device manufacturing method. The invention further relates to a method of transferring a pattern from a patterning device onto a substrate, and to a computer program product for controlling a lithographic apparatus to implement steps of such methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Whichever type of apparatus is employed, the accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. These operations, being time-consuming, limit the throughput of the lithography apparatus, and consequently increase the unit cost of the semiconductor or other products. Various steps have been taken to mitigate these delays in the prior art. For example, the introduction of dual wafer tables, so that two wafers can be loaded in the machine simultaneously. While a first wafer is undergoing exposure in an exposure station, a second wafer is undergoing measurement processes to establish an accurate 'wafer grid' and height map. The apparatus is designed so that the tables can be swapped without invalidating the measurement results, thereby reducing the overall cycle time per wafer. Other techniques to process measurement and exposure steps in parallel may be employed as well. Nevertheless, an overhead is still incurred which limits the throughput that can be achieved.

Additionally, because the measurement operations and the exposure operations for each wafer are somewhat separate in space and time, there is the potential for errors to creep in due to temperature fluctuations, mismatch between the dual stages and so forth. While these errors have been within tolerances for present generations, any source of error will become significant as one strives toward the goal of reaching ever-higher levels of resolution and overlay accuracy.

SUMMARY

It is desirable therefore to mitigate further the measurement overhead and/or measurement and positioning errors in lithographic apparatus.

According to an aspect of an embodiment of the invention, there is provided a lithographic apparatus arranged to transfer a pattern from a patterning device onto a substrate, in which a measuring subsystem comprises one or (preferably) more alignment sensors directed at the substrate near a patterning location of a patterning subsystem. The alignment sensor(s) is operable to recognize and measure alignment marks on the substrate during relative motion of the substrate and patterning subsystem under control of a positioning subsystem. The positioning subsystem moves said substrate support, said patterning subsystem and said patterning device relative to each other in a sequence of movements such that said pattern is applied repeatedly at a plurality of desired portions of the substrate, the location of each portion being defined accurately with respect to the alignment marks present on the substrate. The alignment sensor(s) is(are) operable in the course of said sequence of movements to recognize and measure alignment marks on the substrate to generate updated measurements. The positioning subsystem is operable to use said updated measurements, optionally in combination with previous measurements, in applying of said pattern to a subsequent substrate portion.

In an embodiment, the updated measurements are performed after applying the pattern to a first substrate portion.

The measurements can be taken without significant reduction of throughput, while reducing the delay between the measurement time and the time of using the measurement. Preliminary measurements of relative locations of a plurality of said marks can be used to provide measurement results with an accuracy sufficient for the positioning subsystem to position the first substrate portion at said patterning location relative to said alignment marks.

According to an aspect of an embodiment of the invention, there is provided a device manufacturing method comprising transferring a pattern from a patterning device onto a substrate, the method comprising:

providing a patterning subsystem for receiving said patterning device and applying said pattern to a portion of said substrate held at a patterning location;

holding the substrate on a substrate support;
measuring the locations of a plurality of alignment marks on said substrate so as to locate those marks directly or indirectly with reference to the patterning location;
operating said patterning subsystem while using results of said measuring step to position said substrate support, said patterning subsystem and said patterning device relative to each other in a sequence of movements such that said pattern is applied repeatedly at a plurality of desired portions of the substrate; and
processing said substrate to create product features in accordance with the applied pattern,
wherein said measuring step is performed using one or more alignment sensors directed at the substrate, by operating said alignment sensor(s) in the course of said sequence of movements to recognize and measure alignment marks on the substrate to generate updated measurements, and wherein said updated measurements are used in combination with previous measurements in positioning said substrate support, said patterning subsystem and said patterning device relative to each other for the applying of said pattern to a subsequent substrate portion.

In an embodiment, the updated measurements are performed after applying the pattern to a first substrate portion.

In an embodiment, said alignment marks include marks provided on the substrate for the alignment sensor, though they could be marks provided for other purposes, and even patterns present in a product pattern, used opportunistically for alignment. Alignment in this context is used primarily to refer to measurement in either one or two dimensions parallel to a substrate surface.

According to an aspect of an embodiment of the invention, there is provided a lithographic apparatus arranged to transfer a pattern from a patterning device onto a substrate, in which a measuring subsystem comprises one or (preferably) more alignment sensors directed at the substrate near a patterning location of a patterning subsystem. The alignment sensor(s) is operable to recognize and measure alignment marks on the substrate passing by the sensor during relative motion of the substrate and patterning subsystem under control of the positioning subsystem. A processor for combines measurements of relative locations of a plurality of said marks to provide measurement results with an accuracy sufficient for the positioning subsystem to position at least a first substrate portion at said patterning location relative to said alignment marks.

According to an aspect of an embodiment of the invention, there is provided a method of transferring a pattern from a patterning device onto a substrate, the method comprising:
providing a patterning subsystem for receiving said patterning device and applying said pattern to at least a portion of said substrate held at a patterning location;
holding the substrate on a substrate support;
measuring the locations of alignment marks on the substrate relative to the patterning device;
using results of said measuring step to position said substrate support, said patterning subsystem and said patterning device relative to each other such that said pattern is applied a desired portion of the substrate, the location of said portion being defined accurately with respect to alignment marks present on the substrate; and
processing said substrate to create product features in accordance with the applied pattern, wherein said measuring step is performed using a plurality of alignment sensors directed at locations on the substrate distributed around the patterning location, by operating said alignment sensors in the course of said sequence of movements to recognize and measure alignment marks on the substrate to generate an updated measurement, and wherein said updated measurements are used in positioning said substrate support, said patterning subsystem and said patterning device relative to each other for the applying of said pattern to a subsequent substrate portion.

According to an aspect of an embodiment of the invention, there is provided a computer program product containing one or more sequences of machine-readable instructions for controlling a lithographic apparatus, the instructions being adapted for controlling the measurement and positioning steps of a method as set forth in any of the aspects of the invention above.

These and other features and advantages of particular embodiments of the invention will be understood by the skilled reader from a consideration of the exemplary embodiments discussed below.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 10A and 10B show some specific embodiments of the alignment sensors that might be used in the configuration as displayed in FIG. 9;

DETAILED DESCRIPTION OF EXEMPLARY EMBODIMENTS

Figure 1:
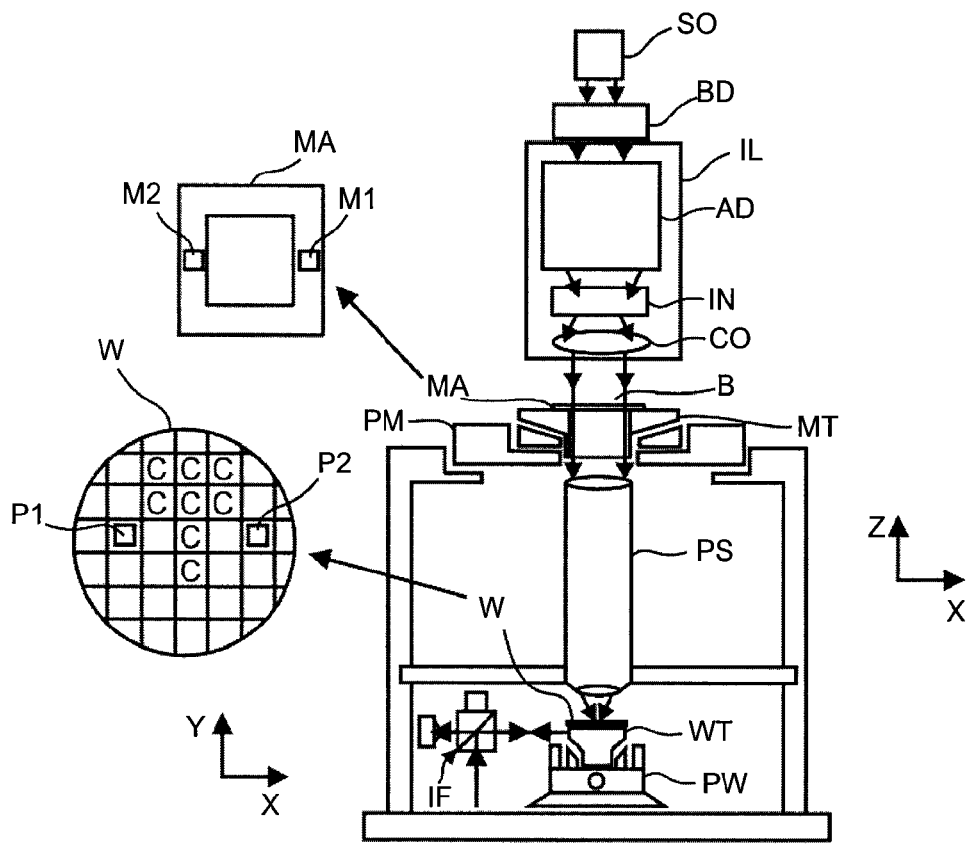
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g., UV radiation or EUV radiation).

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. An example will be described below, with reference to FIGS. 4 and 5. In certain embodiments, the invention disclosed herein provides additional flexibility in both single- and multi-stage apparatuses.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
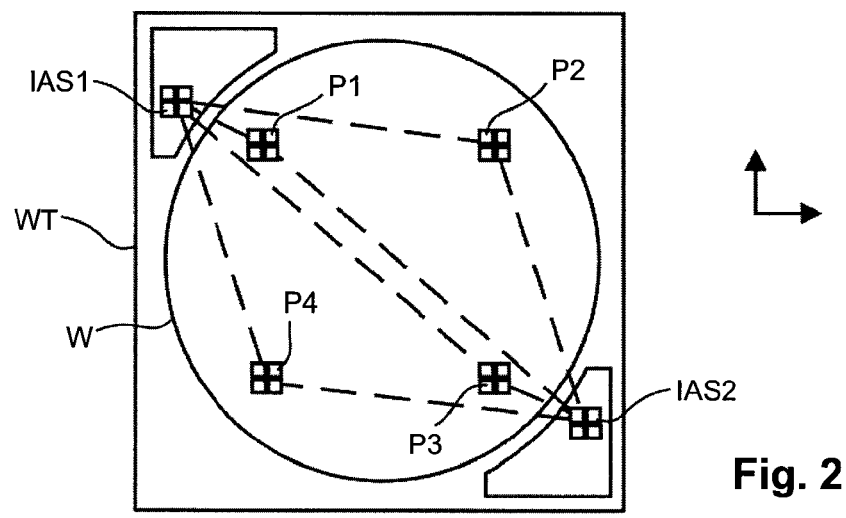
FIG. 2 is a schematic view of a substrate table and a substrate in the apparatus of FIG. 1, showing alignment marks and sensors useful in one embodiment of the invention.

FIG. 2 schematically depicts an arrangement of the substrate table WT depicted in the lithographic apparatus of FIG. 1. In the substrate table WT, two image sensors IAS1 and IAS2 are provided. The image sensors can be used to determine a location of an aerial image of a pattern, e.g., an object mark, on the mask MA by scanning the image sensor IAS1 or IAS2 through the aerial image. Substrate alignment marks P1 to P4 are shown also.

Figure 3A:
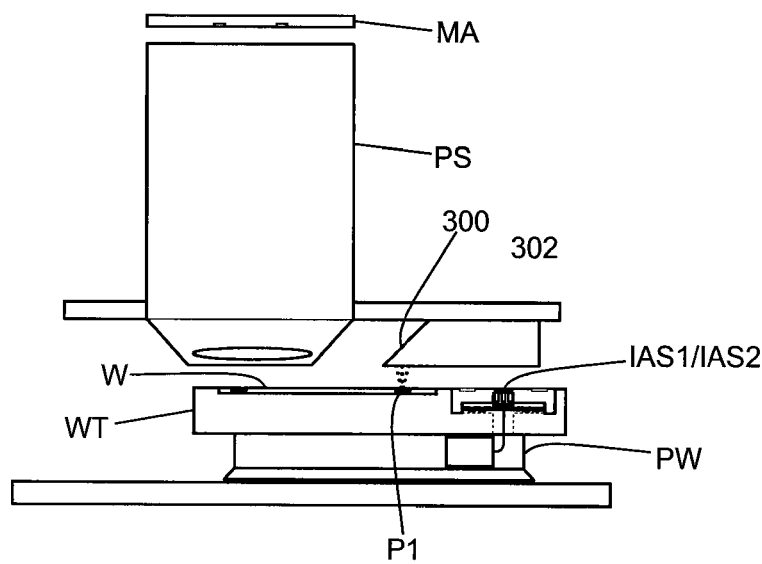
FIGS. 3A to 3C show steps in a known alignment process using the substrate table of FIG. 2.
Figure 3B:
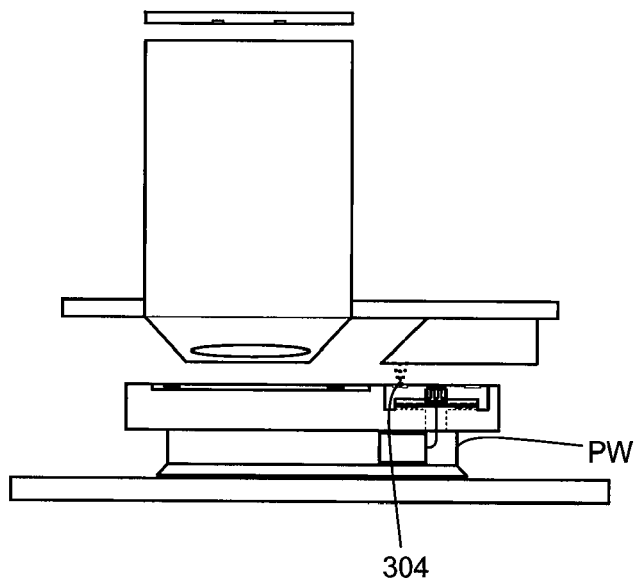
Figure 3C:
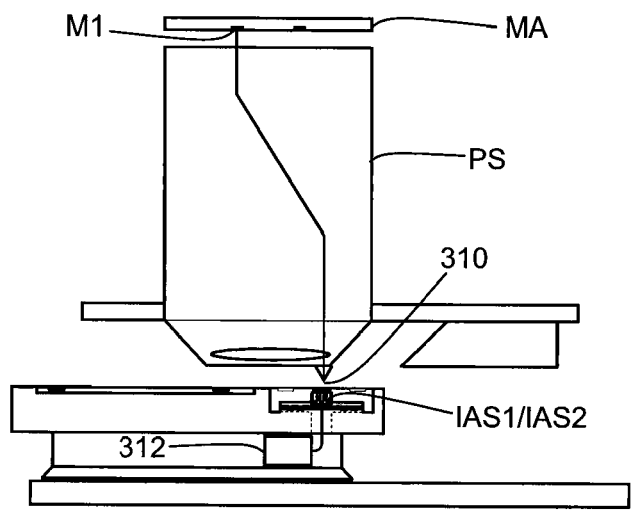

FIGS. 3A to 3C illustrate steps in the alignment process using the sensors IAS1, IAS2. In addition to the parts generally labeled the same as in FIG. 1 and FIG. 2, an alignment sensor 300 is provided to direct an alignment radiation beam 302 in the direction of the substrate W and/or substrate table WT. Sensor 300 detects the properties of the beam 302 when reflected, in order to detect alignment of the sensor 300 to patterns such as P1-P4, illustrated. As shown in FIG. 3B, movement of the substrate table WT, which is measured accurately by sensor IF (shown in FIG. 1) can bring alignment of the radiation beam 302 to bear also on alignment mark 304 which is accurately placed relative to image sensor IAS1, IAS2 etc. Additionally, as shown in FIG. 3C, substrate table WT can be moved to bring image sensor IAS1, IAS2 etc. into the position of an aerial image 310, which is the projection through projection system PS of a mark such as mark M1 on the mask MA. Electronic system 312 detects properties of this aerial image 310, as it is received by sensors IAS1, IAS2, during translational movements of the substrate table WT, to locate in all degrees of freedom the exact location where the last alignment mark M1 projects with optimum alignment (X-Y) and optimum focus (z) onto the sensor IAS1.

By way of the image sensors IAS1 and IAS2, when their position in the substrate table is well-known, the relative position of the aerial image of the pattern on the mask MA with respect to the substrate table WT can be determined. The substrate table WT may be provided with a substrate W comprising substrate marks, e.g., substrate marks P1, P2, P3, P4 as depicted in FIG. 2. Alignment sensor 300, in co-operation with position sensor IF, can obtain relative positions of the substrate marks P1, P2, P3, P4. The knowledge of the relative positions of the substrate marks P1, P2, P3, P4 can be obtained by the alignment sensor steps illustrated in FIGS. 3A and 3B. The relative position of the image of the object mark on the mask MA with respect to the wafer table WT can be deduced from information obtained with the image sensors IAS1, IAS2, (FIG. 3C). These data allow the substrate W to be positioned at any desired position relative to the projected image of the mask MA with great accuracy.

In some embodiments, instead of two image sensors IAS1 and IAS2, more or fewer image sensors may be present, e.g., one or three. The form of these sensors and electronics is known to the skilled person and will not be described in further detail. Alternative forms of alignment mechanism are possible, and useful within the scope of the present invention. In other embodiments, it may be possible to dispense with image sensors IAS1, IAS2, or to provide them on a support separate from the wafer table which carries the substrate.

Figure 4:
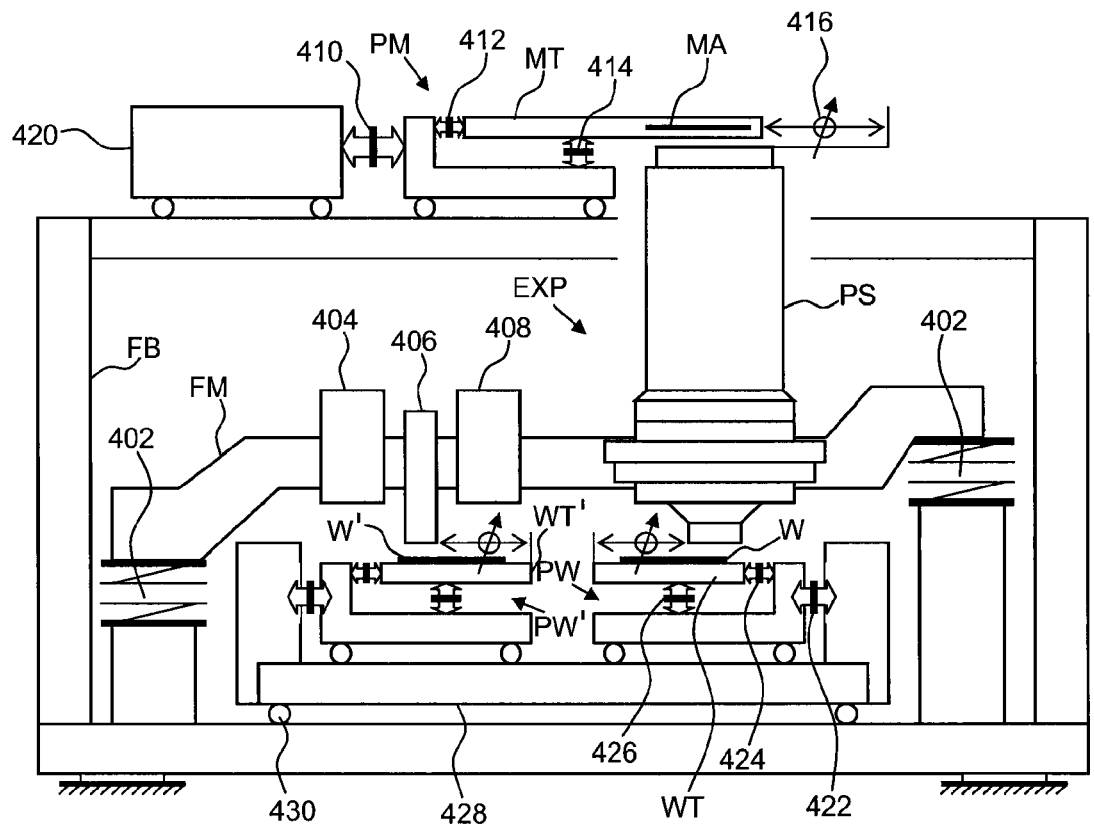
FIG. 4 is a schematic diagram showing components of a lithographic apparatus having separate measurement and exposure stages, usable in an embodiment of the invention.

FIG. 4 shows schematically the arrangement of one embodiment of the apparatus of FIG. 1, in which the apparatus is of the type having dual substrate supports and separate measurement and exposure stations.

A base frame FB supports and surrounds the apparatus on the ground. Within the apparatus, and serving as an accurate positional reference, a metrology frame FM is supported on air bearings 402, which isolate it from vibrations in the environment. Mounted on this frame are the projection system PS, which naturally forms the core of the exposure station EXP, and also instruments 404, 406, 408, which are the functional elements of the metrology frame FM. Above these stations, the mask table MT and mask MA are mounted above the projection system PS. The first positioner PM comprises long-stroke (coarse) actuators 410 and short-stroke (fine) actuators 412, 414, as described above. These operate by active feedback control to obtain the desired position of mask MA with respect to the projection system PS, and hence with respect to the metrology frame FM. This measurement is indicated schematically at 416. The whole positioning mechanism for the mask MA is supported on the base frame at B via active air bearings etc. A balance mass 420 is provided to mimic at least coarse movements of the mask table MT and positioning, to reduce vibrations being transmitted into the frame and other components. A low frequency servo control keeps balance mass 420 in a desired average position.

Wafer table WT shown beneath the projection system similarly has coarse actuators 422 and fine actuators 424, 426 for positioning substrate W accurately with respect to the exit lens of the projection system PS. Additionally, according to the dual-stage arrangement of this example, a duplicate wafer table WT' and positioning mechanism PW' are provided. As illustrated, these duplicate elements are supporting a second substrate W' at the measurement station. Wafer tables WT, WT' and their respective positioners PW and PW' are carried on and connected to a shared balance mass 428. Again, air bearings, or other suitable bearings such as magnetic, electrostatic and so forth, are shown schematically, for example at 430. Measurements of wafer table position used for the coarse and fine control of the positions of the wafers W and W' are made relative to elements 406 at the measurement station and PS at the exposure station, both of these ultimately referring back to the metrology frame FM.

Figure 5:
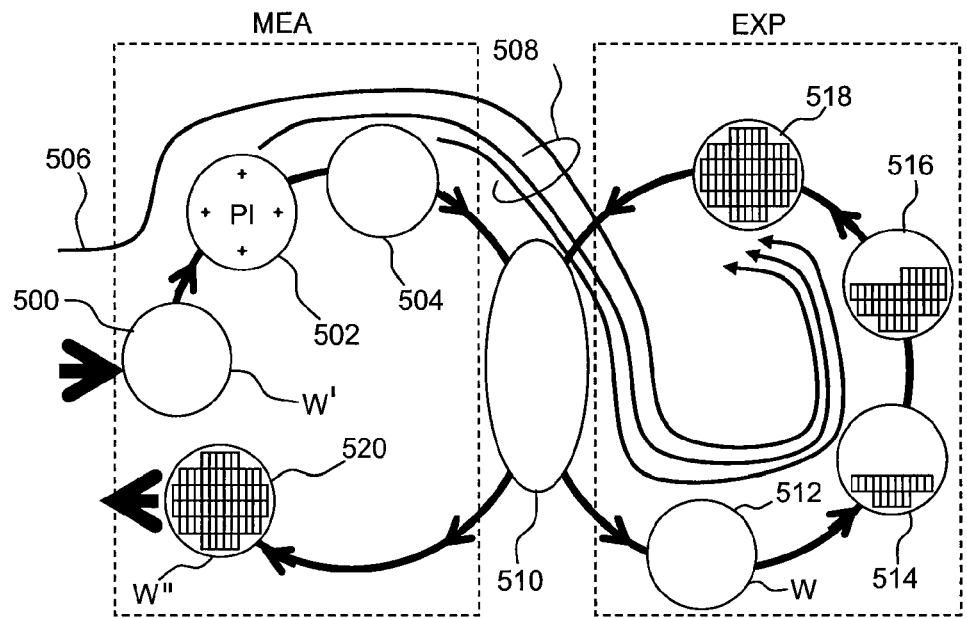
FIG. 5 illustrates schematically the stages in the measurement and exposure processes in the apparatus of FIG. 4, according to known practice.

FIG. 5 illustrates the steps in the dual stage apparatus of FIG. 4 to expose target portions (e.g., dies) on a substrate W. On the left hand side within a dotted box are steps performed at a measurement station MEA, while the right hand side shows steps performed at the exposure station EXP. A substrate W has already been loaded into the exposure station. A new substrate W' is loaded to the apparatus by a mechanism not shown at step 500. These two substrates are processed in parallel in order to increase the throughput of the lithographic apparatus. Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. At 502, alignment measurements using the substrate marks P1 etc. and image sensors IAS1 etc. are used to measure and record alignment of the substrate relative to substrate table WT. In practice, several marks across the substrate W' will be measured, to establish a "wafer grid", which maps very accurately the distribution of marks across the substrate, including any distortion relative to a nominal regular grid. At step 504, a map of wafer height against X-Y position is measured also, for use in accurate focusing of the exposed pattern.

When substrate W' was loaded, recipe data 506 are received, defining the exposures to be performed, and also properties of the wafer and the patterns previously made and to be made upon it. To these recipe data are added the measurements made at 502, 504, so that a complete set of recipe and measurement data 508 can be passed to the exposure stage. At 510, wafers W' and W are swapped, so that the measured substrate W' becomes the substrate W entering the exposure station EXP. This swapping is performed by exchanging the supports WT and WT' within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WT (formerly WT') is all that is necessary to make use of the measurement information 502, 504 for the substrate W (formerly W') in control of the exposure steps. At step 512, reticle alignment is performed using the mask alignment marks M1, M2 (FIG. 3C). In steps 514, 516, 518, scanning motions and radiation pulses are applied at successive target locations across the substrate W, in order to complete the exposure of a number of patterns. Thanks to the alignment data and a map of wafer height data, these patterns are accurately aligned with respect to the desired locations, and, in particular, with respect to features previously laid down on the same substrate. The exposed substrate, now labeled W" is unloaded from the apparatus at step 520, to undergo etching or other processes, in accordance with the exposed pattern.

By employing the separate substrate tables, the performance of the apparatus in terms of substrate throughput through the exposure stages is maintained, while permitting a relatively time-consuming set of measurements to be performed to characterize the wafer and patterns previously deposited upon it. On the other hand, the provision of dual stages, each with its respective positioner PW, PW' sensors etc. adds significantly to the cost of the apparatus. Moreover, since there is a definite time interval (e.g., 30-60 seconds) between performance of the measurements in steps 502, 504 and the ultimate exposure, using those measurements in steps 514, 516, 518, a risk arises that the dimensions of the substrate and its position, both globally and locally, would change prior to exposure of a specific target location, leading to a loss of accuracy in alignment (overlay error). In particular, although the temperature of the environment both within and outside the apparatus is very carefully controlled, even slight temperature variations arising over the aforementioned time interval can be enough to cause distortion of the pattern as laid on the wafer.

Figure 6A:
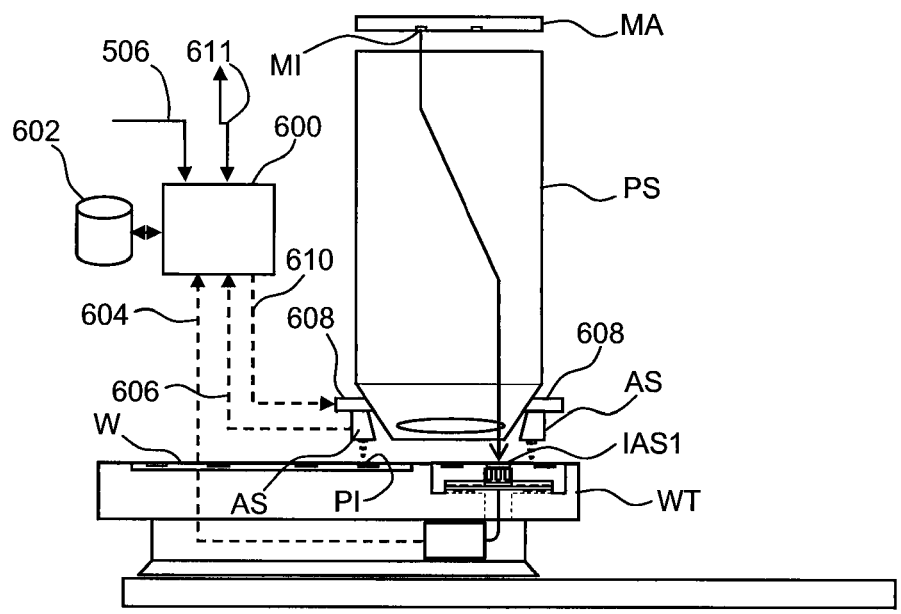
FIGS. 6A and 6B illustrate a novel measurement apparatus associated with the projection system in a lithographic apparatus of the type described in the FIG. 1 to 4.
Figure 6B:
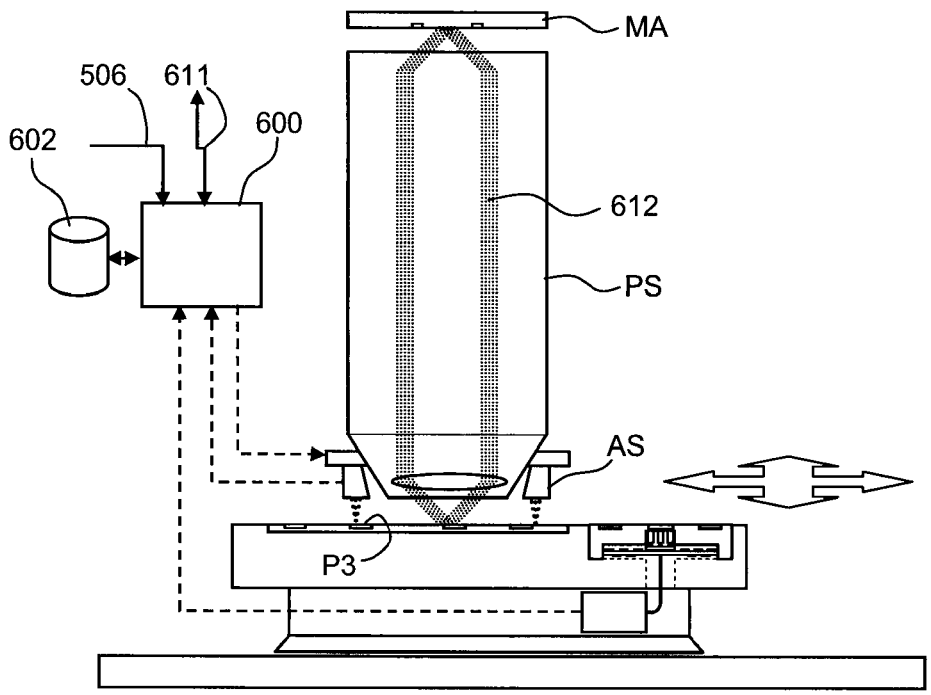

FIGS. 6A and 6B illustrate a modified apparatus in which alignment and level sensing can be performed in parallel with set up of a substrate at the exposure station EXP in the apparatus of FIG. 4, and generally any type of lithography apparatus. To enable this, a plurality of alignment sensors AS are distributed around the exit lens of projection system PS so as to detect substrate marks P1 etc. from substrate W in parallel with (a) alignment of mask alignment marks M1 etc. with image sensor IAS1 or equivalent, and/or (b) in parallel with exposure of die patterns progressing across the substrate (steps 512-518 in FIG. 5). Depending how quickly and comprehensive these measurements can be made, it may be that the measurement steps 502 and 504 as indicated in FIG. 5 can be eliminated entirely, and additionally the time taken for the swapping step 510. The second stage may then be eliminated without a great penalty in throughput.

Processing unit 600 and associated database storage 602 receives the recipe data 506 mentioned above at the time of loading a new substrate W. Unit 600 receives signals 604 from the image sensors IAS1 etc. and also signals 606 from the plurality of alignment sensors AS. Not shown in FIG. 6 but preferably also present is a plurality of level sensors LS. A combined sensor block can be constructed which uses common optical components for level sensing and alignment sensing, or these functions can be separated, as will be described further below. Each alignment sensor AS is carried on the projection PS or metrology frame via an adjustable support 608 controlled by signals 610 from processing unit 600. A connection 611 with controllers of the positioning subsystem (PM, PW) is also provided, so that measurements by sensors AS can be synchronized very accurately with movements and other sensing signals performed by the reticle and substrate during measurement and patterning operations.

FIG. 6A illustrates the step of reticle-to-substrate table alignment, similar to FIG. 3C above. In general, more than one image sensor or similar mark will be used to align the reticle image and the substrate table in more than one degree of freedom with sufficient accuracy. In the example described above with reference to FIGS. 2 and 3A-3C, the projected aerial image of mark M1 is moved from sensor IAS1 to IAS2, or rather substrate table WT is moved relative to the projection system and reticle, which remain stationary. In the course of this transit, according to the novel system, alignment sensors AS scan the substrate and pick up marks P1 etc. which pass under them in the course of the motion. In general this means that no separate, time-consuming stage of measuring the alignment marks is required. An apparatus can be designed and manufactured without dual stages, or the dual stage arrangement may be used purely for loading and unloading.

Furthermore, FIG. 6B illustrates the process whereby alignment sensors AS continue to pick up and measure the location, orientation and height of marks on the substrate, during exposure of portions of the substrate W, indicated by patterning beam 612. Processing unit 600 processes and stores the signals from all the sensors and the positioning subsystem, identifying alignment marks on an opportunistic basis, and/or on a programmed basis requiring only minor deviations of the movement of the substrate from its normal exposure path. These measurements can be used in a variety of ways as described below.

Figure 7:
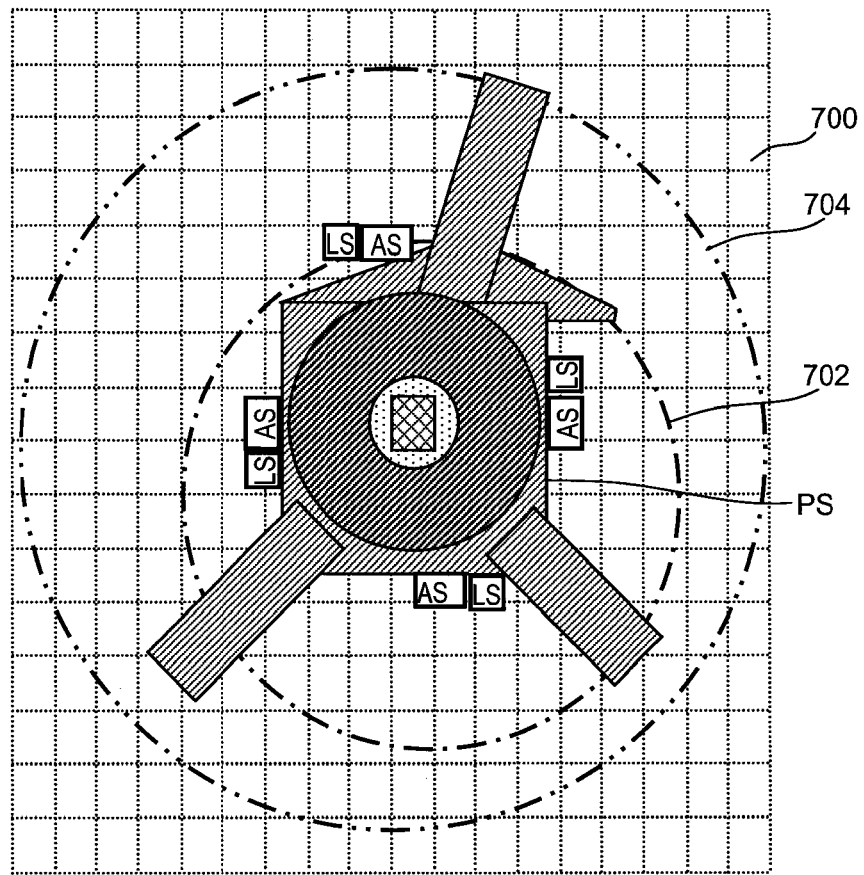
FIG. 7 is a schematic plan view of the apparatus of FIGS. 6A and 6B in relation to example substrate sizes and wafer grid.

For further illustration, FIG. 7 illustrates in plan view the layout of target portion rectangles on a rectangular grid 700, with the hatched outline of the projection system PS superimposed on the grid. At the centre of the projection system is indicated, schematically, a cross-hatched rectangle, representing the current target portion location for scanning exposure. Dotted lines on the grid correspond in particular to the scribe lanes between target portion areas, in which alignment marks can be distributed relatively freely. Different sizes of substrate may be encountered. The single chain dotted outline 702 indicates, for example, the outline of a circular semiconductor wafer of 300 mm diameter. Double chain dotted outline 704 represents a 450 mm wafer, for comparison. Distributed around projection system as close as possible to the exposure area are alignment sensors AS and level sensors LS, for example in four pairs as shown. The number of these allows them redundantly to pick up alignment marks on an opportunistic basis as they traverse the scribe lanes.

Figure 8:
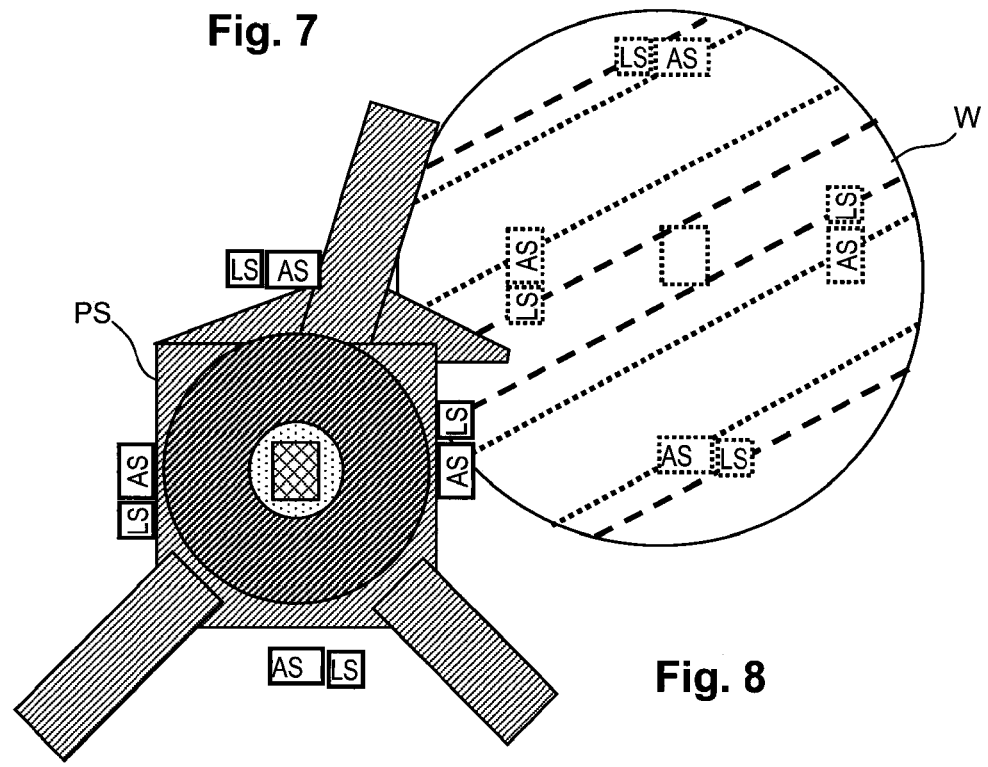
FIG. 8 illustrates schematically measurement locations accessible to sensors of the FIG. 7 apparatus, in one pass of the substrate.

FIG. 8 illustrates the tracks of the level sensors (dashed lines) and alignment sensors (dotted lines) traversing once in a straight line from one side of substrate W to the other. By suitable distribution of the sensors and the alignment marks across a substrate, a large quantity of alignment data can be captured "on the fly" for processing in unit 600.

Figure 9:
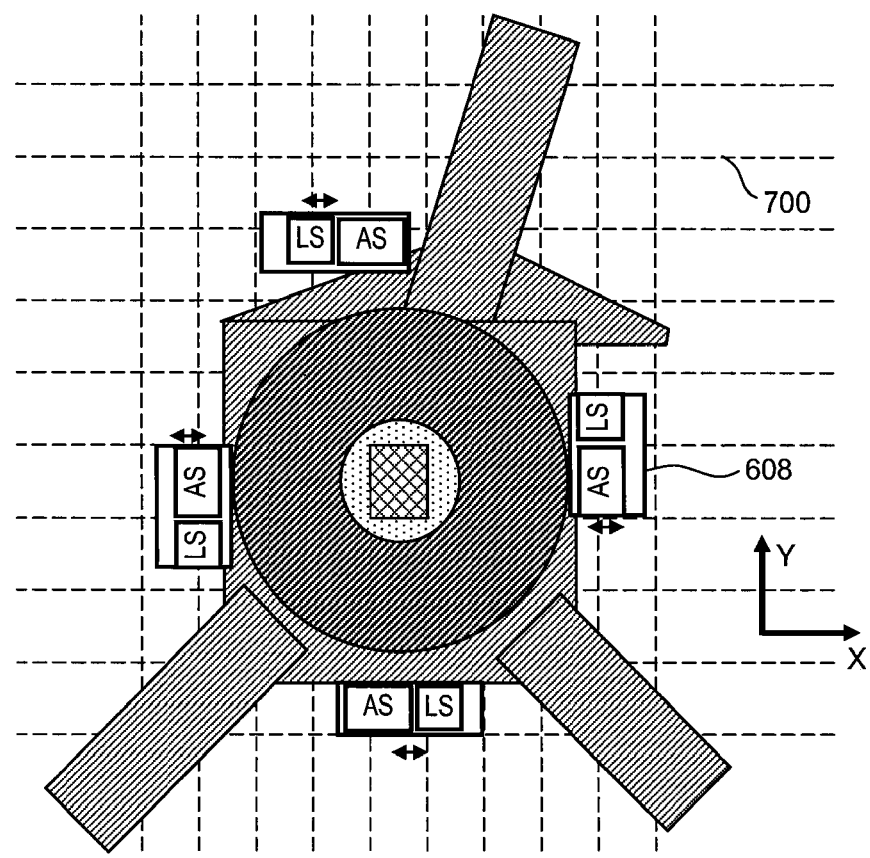
FIG. 9 illustrates wafer grid adjustment of the sensors in the apparatus of FIGS. 6 to 8.

FIG. 9 illustrates a preferred feature of the novel apparatus, in which the relative position between a track of each alignment sensor and the central exposure area (patterning location) can be adjusted. In particular, this is attractive to improve the chance of hitting scribe lane marks, as the pitch of the nominal wafer grid 700 varies in the X and Y directions. Referring again to FIGS. 6A and 6B, the positions of each sensor on its respective support 608 can be adjusted under control of signals 610 from the processing unit 600. This in turn reads the recipe data 506 to derive optimum positioning of the sensors relative to the exposure area at the centre. Thus, as the exposure location is scanned across each target location pattern in the Y direction, sensors on one, two or more sides of the location traverse the scribe lanes and pick up marks placed near, rather than traversing "empty" space between the scribe lanes. Of course, as an alternative, alignment could be performed on the basis of recognized patterns within the target portion areas. This is more difficult to achieve without disrupting the content of the products being manufactured, but in principle the term 'alignment mark' should be interpreted to include product features which, opportunistically, are recognized and used as alignment marks by the alignment apparatus, as well as marks specifically provided on the substrate for that purpose.

Depending on the types of sensors and the types of movements executed during set-up and patterning, some sensors may pick up the alignment marks in the X-direction scribe lanes, particularly as the substrate is moved in an X direction between target portion locations. In summary, however, by proper positioning of the marks and the sensors, and providing a redundant number of each, a large number of measurements can be made in the course of the routine movements during exposure, without adding delay to the production cycle. In this embodiment, all four alignment sensors AS will read marks containing at least Y alignment information, during the routine exposure scanning movements. This includes e.g., 45-degree oriented marks. In principle, as discussed further below, separate sensing of X and Y information, and even separate marking of X and Y are encompassed within the scope of the invention.

FIG. 9 shows separate level sensors and alignment sensors LS, AS respectively. While the examples illustrate alignment sensors and level sensors in pairs, they may be distributed independently. In an alternative embodiment, a combined optical system for alignment and level sensing can of course be provided at each location. The number of sensors is shown as 4, but of course 3, 8 and other numbers are possible. The number of level sensors is not necessarily the same as the number of alignment sensors. The sensors are preferably very much smaller and lighter than the traditional alignment sensor 300 (FIG. 3A), so as not to interfere with other components in the exposure apparatus, and so as not to place undue loading on the housing of projection system PS to which they are mounted. Alternatively, they may of course be mounted separately in the vicinity of projection system PS. Adjustment of the location of each sensor relative to its mounting 608 can be with a relatively large range, such as the size of a field (a few centimeters), with an accuracy of the order of a couple of microns. Adjustment may be, for example by piezoelectric actuators. In a preferred embodiment, such adjustment is performed by piezoelectric motors and then a locking mechanism is engaged, for example by magnetic or other clamping, to prevent relative movement between the sensors and the exposure location during exposure operations. Adjustment can be performed per substrate, but more likely an adjustment per lot is appropriate, on the assumption that all substrates in the lot are to receive the same pattern according to the same basic recipe data 506. (This does not exclude the possibility that the recipe data 506 also includes substrate-specific information, but such substrate specific information will normally not affect the desired positioning of the alignment sensors.)

The adjustability of the four sensors in FIG. 9 is illustrated as being in the X-direction only, so as to maximize coverage of Y-oriented scribe lane marks. Adjustability of the sensors in X- and/or Y-directions, and also Z direction (height) may be appropriate in a given embodiment.

If the relative position of the sensors AS to the projection system could be very accurately determined by such motors and their feedback mechanisms, the image sensor alignment step illustrated in FIG. 6A could in principle be eliminated. In practice at least where the novel system is employed in an existing apparatus design, it will be easier to apply the conventional accurate alignment steps, particularly for the reticle-to-substrate alignment (IAS1 or similar arrangement), and then complete the information such obtained with the AS and LS. That way, the mounting and positioning of the sensors AS need to be well fixed, but the absolute position, or position relative to other components, can then be measured, rather than being engineered to any great accuracy.

Figure 10B:
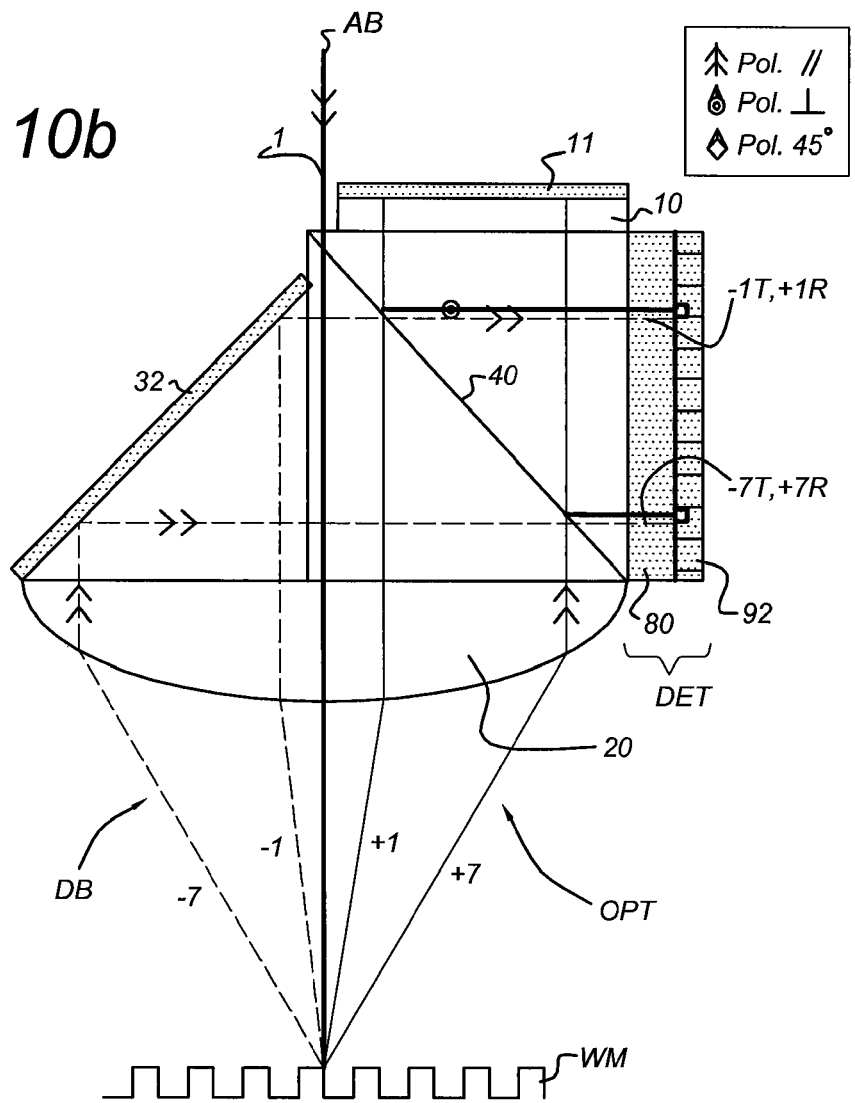

Some specific embodiments of the alignment sensors that might be used in the configuration as displayed in FIG. 9 are shown in FIGS. 10a and 10b. These alignment sensors comprise a self-referencing interferometer and they have the advantage that they are relatively cheap and that they are compact so that they can be located in the direct vicinity of the exposure area. Of course other configurations of alignment sensors with a self-referencing interferometer are possible and alignment sensors without self-referencing interferometer are suitable for the configuration as displayed in FIG. 9.

Figure 11:
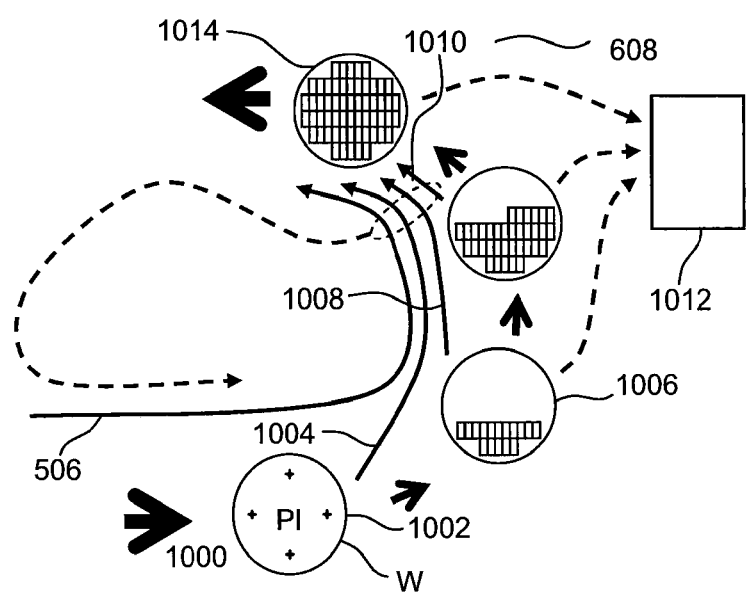
FIG. 11 illustrates schematically the process steps and data flow in a combined alignment and exposure process of the novel apparatus.

FIG. 11, by contrast with FIG. 5, shows the much abbreviated processing steps for a substrate W, employing the novel features of the system just described. In a first step 1000, substrate carrying alignment marks P1 etc. is loaded onto the substrate table WT. In step 1002, alignment measurements using image sensors IAS1 etc. are taken. In parallel with the loading, recipe data 506 is received and the relative positions of sensors AS, LS mounted on the projection system are adjusted and locked so as to optimize the pick-up of alignment marks contained in the scribe lanes on the received substrate W. In the course of traverse from sensor IAS1 to IAS2, and/or mask marker M1 to M2, a number of these alignment marks are detected and signals processed by unit 600 to obtain accurate alignment of the substrate W with the substrate table WT and reticle MA. Data 1004 from this is added to the database for use in positioning and control during subsequent exposure step 1006. Even while initial target position locations are being exposed, further data of the alignment marks is added at 1008, 1010 and so forth. All this data is additionally accumulated in a statistical database 1012, stored by unit 600 in storage 602. At the conclusion of exposure of all the target positions, substrate W is unloaded at 1014, and a fresh substrate W is loaded at 1000 for the process to begin again.

As indicated at 1016, the collection of data 506, 1004, 1008, 1010 can be fed back from the database as additional data. This data may be substrate specific, apparatus specific, or mask specific as desired. It may be employed in real-time and later.

Figure 12:
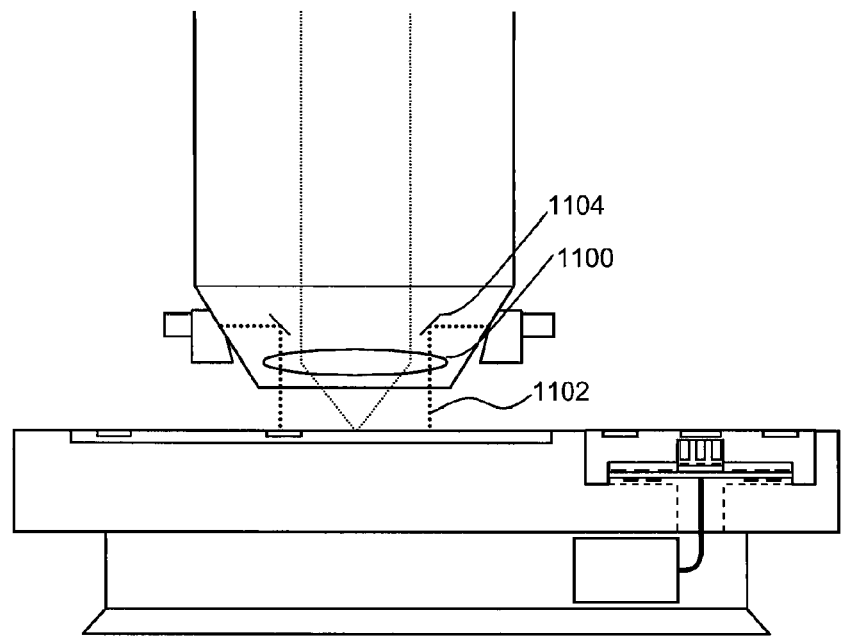
FIG. 12 illustrates schematically a modified embodiment of the apparatus of FIGS. 6 to 10.

FIG. 12 shows an alternative embodiment in which alignment sensor beams are directed internally through the last lens element 1100 of the projection system PS itself. By this measure, the scribe lanes or other locations which are inspected by the alignment sensors are made even closer to the target portion location which is being exposed currently with the image 1102. This has the advantage that a sensor is less likely to be positioned off the edge of the substrate, as the target portion location being exposed approaches that edge. Of course, the alignment sensing can also benefit from the high quality of the projection lens. The closer the sensors are to the patterning location, the more relevant and timely are the measurements made in the course of exposure. In the case of an immersion lithography system, if the sensors have to be positioned outside the location of the immersion head (not shown), they may need to be even further from the patterning location. In order to pass alignment radiation beams through the last lens element 1100, mirrors 1104, which may be small and/or half-silvered, are placed behind the lens element.

In summary, the novel apparatus can take advantage of movements of the wafer at the exposure stage to read alignment marks and the wafer height level around the target portion that is being exposed. One benefit of this is for the size and cost of the measurement stage to be removed. Furthermore, however, the measurements can be taken in real-time, to minimize errors caused by the wafer grid varying with time. Time-consuming steps due to the use of a dual stage apparatus, such as chuck swapping, and also errors arising from chuck-to-chuck difference can be eliminated.

Furthermore, because the reading of marks can be performed on a highly redundant basis, the novel system offers improvement in accuracy and useful statistical analysis. The focus budget (depth of focus) for the alignment sensor may be for example 100 micron, which is much wider than that typically required for imaging (usually less than 100 nm). Since the aerial image of the pattern to be exposed is matched closely to the substrate service when exposing, the alignment sensor will, without any effort, remain in focus.

If the number and placing of the sensors is sufficient, a single mark can be read by different sensors, and/or several times by the same sensor at different times. These redundancies can be exploited by processing in the unit 600 to improve localization of the marks. The adjustability of the sensor locations, described and illustrated in FIG. 9 above, allows the system to maximize the pick up of alignment marks with a variety of target portion sizes. A trade-off can be applied in a design process between the spacing of the sensors away from the exposure location, size of wafers to be handled, the convenience of accessing the lens element 1100 and the number of sensors. Where the sensing radiation travels through the last lens element 1100, and the use of a high index immersion fluid (water) will reduce the spreading of the diffracted orders, and as thus help their capturing by the sensor.

In alternative embodiments, line sensors can be used, each being able to read only one mark orientation (e.g., X, Y, or 45 degree gratings). A scanning movement in the Y-direction will give the Y position marks. A "go to next target portion" movement, which includes movement in the X-direction, will give the X position of the marks. Line sensors, although their number may need to be double, can offer a larger scanned area at lower cost. Redundancy may therefore be reduced as well as sensor and processor complexity. An example with line sensors is illustrated schematically in FIGS. 13A and 13B.

Figure 13A:
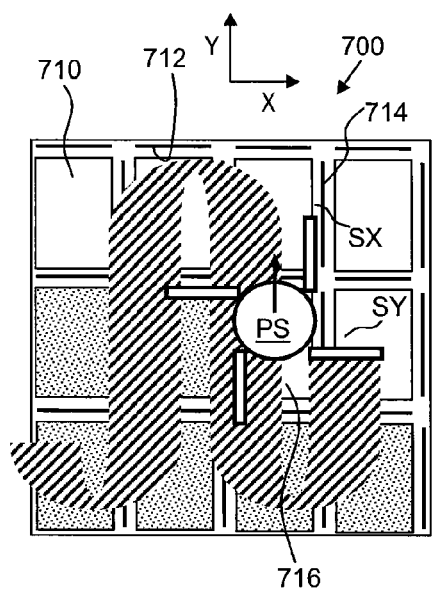
FIGS. 13A and 13B illustrate schematically element locations accessible to sensors of an apparatus in an alternative embodiment.
Figure 13B:
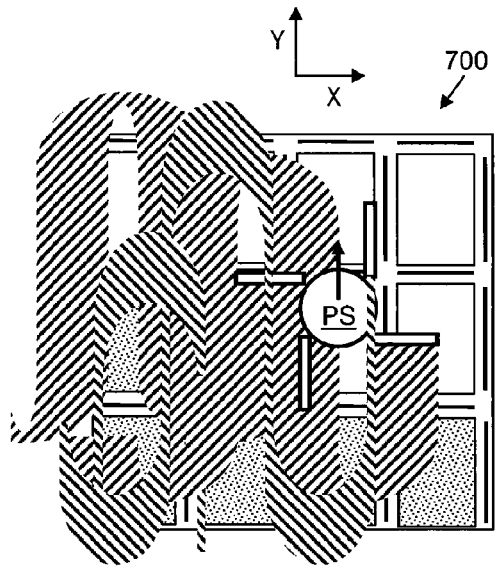

FIGS. 13A and 13B show schematically a modified form of the apparatus including line sensors arrayed around the exit of the projection system PS. In the example shown, line sensors in orthogonal orientations are labeled SX, and SY, according to whether they provide an information on the X or the Y position of the mark. A local section of the wafer grid 700 is illustrated in graphic outline. Within this grid, twelve individual target portion areas 710 can be seen clearly in three rows or four, with scribe lane markings 712 and 714 present in the horizontal (X-axis) and vertical (Y-axis) spaces between the target portion areas.

In FIG. 13A, a projection system PS is making a scan to expose one target portion area 716. This is the third target portion in the middle row. Shading shows that the bottom row and the first two target portions in the middle row have been exposed already. In reality, it is known that the substrate W makes the scanning motion while projection system remains stationary. For the purpose of this explanation, however, it is easier to regard the projection system as moving relative to the wafer grid. The embodiment illustrated assumes a 'scanning' type of exposure system, in which the patterning location sweeps steadily in the Y direction across the target portion 716 during one exposure. In moving from one target portion to the next, the positioning subsystem does not stop the Y motion and then moves the patterning location in a separate X movement, but rather sweeps from target portion to target portion in a semicircular or at least curved path, as shown. Areas shaded with upwards diagonal hatching (hatching lines running from bottom left to top right) illustrate the scanning coverage of one X-oriented sensor SX. It can be seen that this covers easily the y-oriented scribe lanes 714 etc. It should be understood that the drawing is not to scale. The projection system is likely to be larger in extent than illustrated, and the sensors placed further apart and further from the immediate patterning location.

FIG. 13B illustrates the coverage pattern of both x-oriented and both y-oriented sensors in the course of representative scanning motions of projection system PS. Specifically, the trail of the sensors is shown as the exposure position scans each of the target portions in the middle row. As before, the scanning domain of the X-oriented sensors SX is hatched diagonally upwards in the diagram, while the scanning coverage of sensors SY, oriented parallel to the y-axis, is now hatched diagonally downward (lines running from top right to bottom left). Compared with a point-based sensor, the line sensor has the advantage that, in spite of the curved path followed by the patterning location during movement between target portions, some parts of the Y-oriented line sensor will be moving over the X-oriented scribe lanes for an extended period of time. Therefore the opportunity for a line sensor to pick up X direction alignment information is maintained where a point sensor would have difficulty capturing a mark.

As mentioned before, the layout and coverage of these sensors is shown only schematically in FIGS. 13A and 13B, to illustrate the principles of operation. In the schematic illustrations of FIGS. 13A and 13B, the line sensors are shown covering the scribe lanes immediately adjacent the target portion 716 which is currently being exposed. In reality, as illustrated in FIGS. 7 and 8, for example, it will not be possible to make the alignment detection so close to the currently exposed target portion, but rather the scribe lanes scanned will be the ones several grid units away from the currently exposed target portion. The form of the line sensors SX, SY is open to many different implementations. A line sensor may be made of several individual pixels in a linear array, or may be a single pixel scanning the entire line. Sensors arrayed at 45 degrees to the x- and y-axes may be provided, capable of picking up both x-axis and y-axis alignment marks. The length of each line sensor SX, and accordingly its scanning width, may be such that a range of target portion sizes can be accommodated without the need for adjustable positions illustrated in FIG. 9 above.

Additionally, it is possible to mix different sensor types in the same system. A particular example of this, addressing the difference in X and Y direction movements present in a scanning type of lithographic apparatus, would be to provide a combination of point and line type sensors. In one such embodiment, a point type sensor or sensors may be provided for picking up Y information (for example, marks in the Y-oriented scribe lanes 714), while a line type sensor or sensors oriented in the Y direction is provided for picking up X information (for example, from marks in the X-oriented scribe lane 712). The X and Y scribe lanes are conveniently used for X- and Y-oriented marks respectively, but it is also possible to locate both types of marks in the one type of scribe lane, either as separate marks or a combined mark. As mentioned already, patterns present in the product design itself may also be used for alignment, if they can be recognized and measured reliably and the design freedom is not unduly compromised. It is conventional for the scribe lane space to be used for experimental structures connected with device and circuit development, so it is not desirable to consume all the free space with alignment marks for the lithographic process.

In an embodiment implementing a stepping rather than a scanning process, other opportunities arise for picking up alignment marks. During one patterning step, the projection system and substrate may be stationary relative to one another, potentially permitting a different type of alignment sensing. Furthermore, the system is more likely to include distinct X and Y motions in the course of a patterning sequence, rather than the arcuate sweeping motion illustrated in FIGS. 13A, 13B. Additionally, where the description of embodiments refers for simplicity to 'exposure' and 'projection systems' as examples of patterning steps and apparatus, the same discussions can be applied by the skilled reader where patterning is by imprint, electron beams and the like.

Where alignment in only one dimension can be measured readily during patterning movements, embodiments of the invention can be applied to use said movements opportunistically for measurements in that dimension only, while other movements are made dedicated to measurement in the other dimension. Even though there is potentially a throughput penalty from such dedicated movements, the delay will be less than for full two-dimensional alignment measurement, and may yet allow an overall throughput improvement and/or apparatus cost reduction.

Data acquired from the alignment and level sensors around projection system PS can serve a double purpose: alignment and feedback. With regard to alignment, marks can be used in several ways:
- Marks located around an unexposed target portion can be used for direct alignment of the target portion.
- Marks located around exposed target portions can be used for aligning unexposed target portions (prediction of the location, interpolation, extrapolation and modeling of the wafer grid at multiple orders).
- All marks that have already been read can contribute to further defining the grid of the wafer, and therefore refine the prediction of the location of the marks.

With regard to the feedback applications, marks can be used as feedback for real-time correction of exposure parameters:
- (a) Whenever a mark is measured several times by the same sensor, a reproducibility study through time can be derived.
- (b) Whenever a mark is measured several times by different sensors, a matching study among sensors can be derived (provided one can be de-couple dependency on time).
- (c) Whenever several marks are measured at the same time, extrapolated or interpolated data derived from surrounding marks can be matched to the data from the central mark.
- (d) Steps (a) to (c) can be combined for numerous statistical studies of the reproducibility of the reading of the marks and the variations of the grid through time.

It should be noted that we are talking here of marks in the most general sense of the word. This may include marks from different product layers on the substrate W, which may be acquired at different times including after exposure, anywhere on the substrate. In some cases even marks that are not originally dedicated to alignment can be used, thus saving some real estate on the wafer.

Using the above statistical data and analysis, one can analyze overlay properties, meaning the accuracy with which a pattern in one product is superimposed upon a pattern previously exposed on an underlying product layer. For the production of complex semi-conductor products which are 3-dimensional in nature, accurate overlay is one of the most critical goals of the alignment measurement and control system. In a single scan, or in subsequent scans if needed, the sensors may be operable to read alignment marks from both a top layer and any accessible layer below. The difference in position can provide a real-time measure of overlay. From this, it may be possible to use a predictive model to determine if and which correction is needed for future target portions to be exposed on the same substrate, or on another substrate.

Modeling uses calculation and databases which take into account overlay errors that are target portion-specific, wafer-specific, lock-specific, process-specific and so forth.

Another application, particularly in the case where a line sensor is used, is to read not only the marks but also surrounding patterns. Information can be retrieved from these patterns, analyzed and corrective action taken in control of the exposure apparatus. This may be, for example, to correct dosage of radiation, focus correction and so forth.

Figure 14:
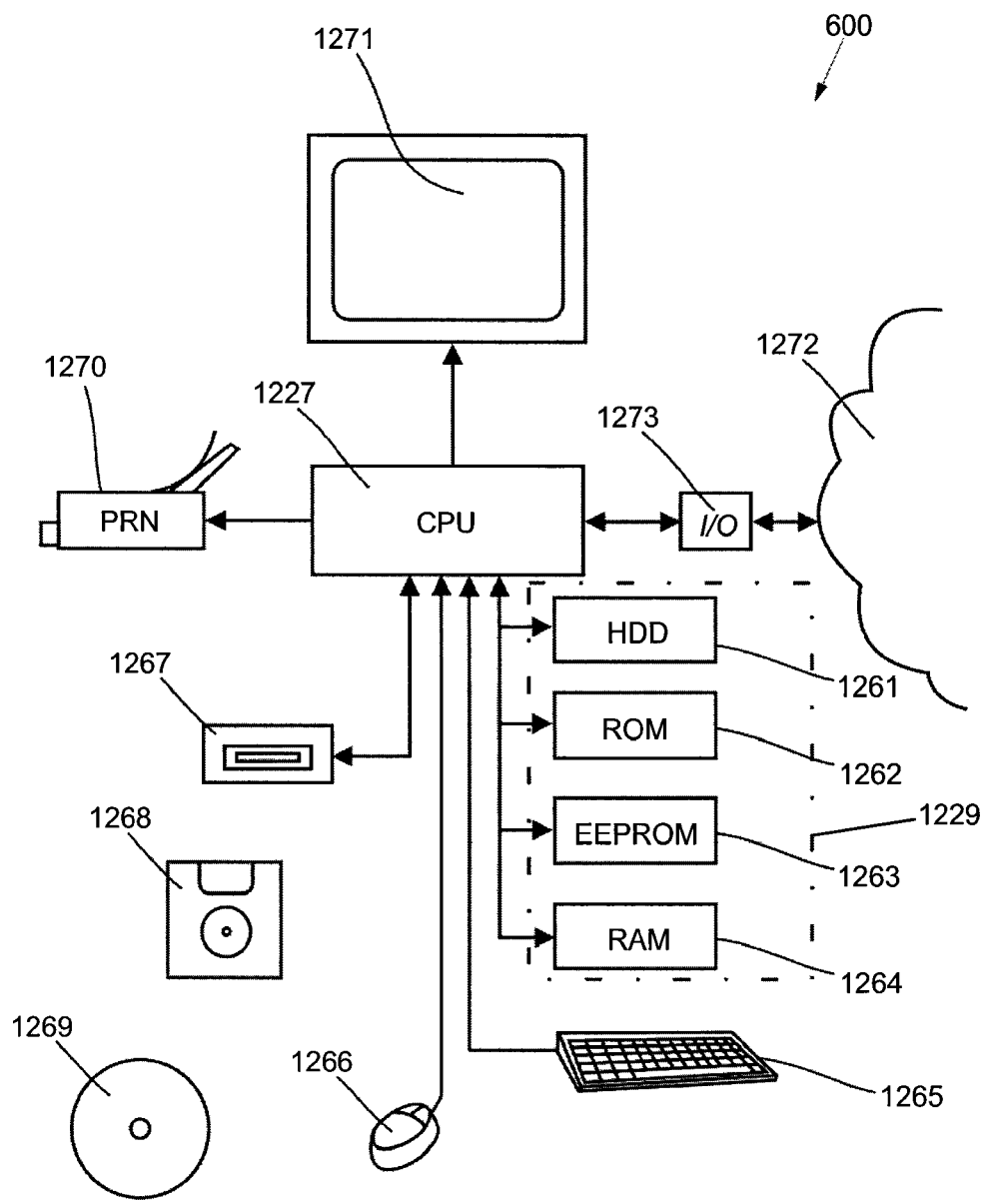
FIG. 14 illustrates computer system hardware useful in implementing the alignment and exposure processes of FIGS. 6 to 11.

It should be understood that the processing unit 600 in the previous embodiments may be a computer assembly as shown in FIG. 14. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 1229 connected to processor 1227 may comprise a number of memory components like a hard disk 1261, Read Only Memory (ROM) 1262, Electrically Erasable Programmable Read Only Memory (EEPROM) 1263 en Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g., in the form of computer executable code, from and under some circumstances store data on a data carrier, like a floppy disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc. by way of transmitters/receivers 1273 responsible for input/output (I/O). The processor 1227 may be arranged to communicate with other communication systems via the communications network 1272. In an embodiment of the invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272.

It is observed that, although all connections in FIG. 1 are shown as physical connections, one or more of these connections can be made wireless. They are only intended to show that "connected" units are arranged to communicate with one another in someway. The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. In addition, it should be appreciated that structural features or method steps shown or described in any one embodiment herein can be used in other embodiments as well.

The present invention may further be described by the following clauses:

1. A lithographic apparatus arranged to transfer a pattern from a patterning device onto a substrate, the apparatus comprising:
    a patterning subsystem for receiving said patterning device and applying said pattern to a portion of said substrate held at a patterning location;
    a substrate support for holding the substrate while said pattern is applied;
    at least one positioning subsystem for moving said substrate support, said patterning subsystem and said patterning device relative to each other in a sequence of movements such that said pattern is applied repeatedly at a plurality of desired portions of the substrate, the location of each portion being defined accurately with respect to alignment marks present on the substrate; and
    a measuring subsystem for measuring the locations of said alignment marks relative to the patterning device, and for supplying measurement results to said positioning subsystem,
    wherein said measuring subsystem comprises one or more alignment sensors directed at the substrate, wherein said alignment sensor(s) is(are) operable in the course of said sequence of movements to recognize and measure alignment marks on the substrate to generate updated measurements, and wherein said positioning subsystem is operable to use said updated measurements in combination with previous measurements in positioning said substrate support, said patterning subsystem and said patterning device relative to each other for the applying of said pattern to a substrate portion or subsequent substrate portion.

2. The apparatus of clause 1 wherein the number of alignment sensors is at least three, the sensors being directed at sensing locations on the substrate distributed around the patterning location such that for any patterning location within a periphery of the substrate, at least one of said sensing locations is over a portion of the substrate.

3. The apparatus of clause 1 or 2 wherein said positioning subsystem and said alignment sensor(s) is(are) operable to recognize and measure alignment marks on the substrate during a transit motion between successive substrate portions.

4. The apparatus of clause 3 wherein said measurement subsystem is arranged to use measurement results obtained from an alignment mark during said transit motion in combination with measurement results from previous motions to control positioning in applying a pattern to a subsequent substrate portion.

5. The apparatus of clause 1, 2, 3 or 4 wherein said positioning subsystem is controlled to apply a pattern from the patterning device to each substrate portion progressively by a scanning motion, and wherein said alignment sensor(s) is(are) operable to recognize and measure alignment marks on the substrate during said scanning motion at one substrate portion.

6. The apparatus of clause 5 wherein said measurement subsystem is arranged to use measurement results obtained from an alignment mark during said scanning motion in combination with measurement results from previous motions to control positioning in applying a pattern to a subsequent substrate portion.

7. The apparatus of any preceding clause wherein said one or more alignment sensor further includes a level sensing function operable during relative motion of the substrate and patterning subsystem under control of the positioning subsystem, the measurement subsystem recording height variation across the substrate surface as well as planar dimensions, the positioning subsystem controlling height as well as planar position of the applied pattern in accordance with said height variation.

8. The apparatus of any of clauses 1 to 6 wherein said measuring subsystem comprises one or more level sensors operable in parallel with said alignment sensor during relative motion of the substrate and patterning subsystem under control of the positioning subsystem, the measurement subsystem recording height variation across the substrate surface as well as planar dimensions, the positioning subsystem controlling height as well as planar position of the applied pattern in accordance with said height variation.

9. The apparatus of any preceding clause wherein said measurement subsystem further comprises one or more additional sensors for aligning a known position of said substrate support relative to alignment marks on said patterning device, the measurement sub-system combining said known position with said relative location measurements for said accurate positioning and patterning.

10. The apparatus of clause 9 wherein said measurement subsystem is arranged to use said additional sensor(s) prior to patterning to measure at least two known positions on said substrate support relative to said alignment marks on the patterning device, and to use said alignment sensor(s) to measure positions of alignment marks on the substrate relative to said known positions during transit between said two known positions.

11. The apparatus of clause 9 or 10 wherein said patterning device is arranged to apply said pattern to a radiation beam entering a projection system, an image of said patterning device being projected onto the substrate at said patterning location to apply the pattern to a substrate portion, and wherein said additional sensor(s) comprises a pattern-specific radiation sensor responsive to a projected image of an alignment mark on said patterning device.

12. The apparatus of any preceding clause wherein said patterning device is arranged to apply a pattern to a radiation beam entering a projection system, an image of said patterning device being projected onto the substrate at said patterning location, and wherein said alignment sensor has a depth of focus more than ten, preferably more than a hundred times that of the projected image.

13. The apparatus of any preceding clause wherein said measurement subsystem includes an actuator for adjusting a position of said alignment sensor relative to the patterning location.

14. The apparatus of clause 13 wherein said measurement subsystem further includes a locking device for locking the relative position of said alignment sensor after adjustment.

15. The apparatus of clause 13 or 14 wherein a controller of said measurement system is arranged to adjust the position of said alignment sensor by reference to recipe data received with a substrate to be patterned.

16. The apparatus of clause 15 wherein said controller is arranged to adjust the alignment sensor position to coincide with scribe lane areas according to a die size specified in said recipe data.

17. The apparatus of any preceding clause wherein said alignment sensor comprises an optical system arranged to project a sensing beam of radiation onto said substrate and to detect a position of said mark in at least two-dimensions by measuring properties of said beam when reflected from the substrate.

18. The apparatus of any preceding clause wherein said alignment sensor comprises an optical system arranged to project a sensing beam of radiation onto said substrate and to detect a position of said mark in at least two-dimensions by measuring properties of said beam when diffracted by the substrate.

19. The apparatus of any preceding clause wherein said alignment sensor comprises a plurality of optical systems each arranged to project a sensing beam of radiation onto said substrate and to detect a position of said mark in one dimension by measuring properties of said beam when diffracted by the substrate, the measurement subsystem combining measurement results from said plurality of sensors to derive a two-dimensional measurement of the position of an alignment mark.

20. The apparatus of clause 19 wherein said alignment sensors are operable to recognize and measure alignment marks in a first dimension on the substrate during a transit motion between successive substrate portions and to measure recognize and measure alignment marks in a second dimension during a scanning motion at one substrate portion.

21. The apparatus of any preceding clause wherein said measurement subsystem is arranged to make statistical combinations of measurements made at different times by the same alignment sensor from different alignment marks on the same substrate.

22. The apparatus of any preceding clause wherein said measurement subsystem is arranged to make statistical combinations of measurements made at different times by different alignment sensors from a single alignment mark.

23. The apparatus of any preceding clause wherein said measurement subsystem is arranged to make statistical combinations of measurements made at different times by the same alignment sensor from a single alignment mark.

24. A device manufacturing method comprising transferring a pattern from a patterning device onto a substrate, the method comprising:
    providing a patterning subsystem for receiving said patterning device and applying said pattern to a portion of said substrate held at a patterning location;
    holding the substrate on a substrate support;
    measuring the locations of a plurality of alignment marks on said substrate so as to locate those marks directly or indirectly with reference to the patterning location;
    operating said patterning subsystem while using results of said measuring step to position said substrate support, said patterning subsystem and said patterning device relative to each other in a sequence of movements such that said pattern is applied repeatedly at a plurality of desired portions of the substrate; and
    processing said substrate to create product features in accordance with the applied pattern,
    wherein said measuring step is performed using one or more alignment sensors directed at the substrate, by operating said alignment sensor(s) in the course of said sequence of movements to recognize and measure alignment marks on the substrate after applying the pattern to a first substrate portion to generate updated measurements, and wherein said updated measurements are used in combination with previous measurements in positioning said substrate support, said patterning subsystem and said patterning device relative to each other for the applying of said pattern to a substrate portion or subsequent substrate portion.

25. The method of clause 24 wherein in said measurement step at least three, alignment sensors are directed at sensing locations on the substrate distributed around the patterning location such that for any patterning location within a periphery of the substrate, at least one of said sensing locations is over a portion of the substrate.

26. The method of clause 24 or 25 wherein said alignment sensor(s) is(are) operated to recognize and measure alignment marks on the substrate during a transit motion between successive substrate portions.

27. The method of clause 26 wherein said measurement step uses measurement results obtained from an alignment mark during said transit motion in combination with measurement results from previous motions to control positioning in applying a pattern to a subsequent substrate portion.

28. The method of any of clauses 24 to 27 wherein a pattern from the patterning device is applied to each substrate portion progressively by a scanning motion, and wherein said alignment sensor(s) is(are) operated to recognize and measure alignment marks on the substrate during said scanning motion at one substrate portion.

29. The method of clause 28 wherein measurement results obtained from an alignment mark during said scanning motion are used in combination with measurement results from previous motions to control positioning in applying a pattern to a subsequent substrate portion.

30. The method of any of clauses 24 to 29 wherein said one or more alignment sensor further includes a level sensing function operable during relative motion of the substrate and patterning subsystem under control of the positioning subsystem, the measurement step including recording height variation across the substrate surface as well as planar dimensions, the positioning subsystem controlling height as well as planar position of the applied pattern in accordance with said height variation.

31. The method of any of clauses 24 to 30 wherein said measuring step comprises using one or more level sensors operable in parallel with said alignment sensor during relative motion of the substrate and patterning subsystem during known relative motion, and recording height variation across the substrate surface as well as planar dimensions, the positioning step including controlling height as well as planar position of the applied pattern in accordance with said height variation.

32. The method of any of clauses 24 to 31 wherein further comprising a step of using additional sensors to align a known position of said substrate support relative to alignment marks on said patterning device, and combining said known position with said relative location measurements for said accurate positioning and patterning.

33. The method of clause 32 wherein said measurement subsystem is arranged to use said additional sensor(s) prior to patterning to measure at least two known positions on said substrate support relative to said alignment marks on the patterning device, and to used said alignment sensor(s) to measure positions of alignment marks on the substrate relative to said known positions during transit between said two known positions.

34. The method of clause 32 or 33 wherein said pattern is applied to a radiation beam entering a projection system, an image of said patterning device being projected onto the substrate at said patterning location to apply the pattern to a substrate portion, and wherein said additional sensor(s) comprises a pattern-specific radiation sensor responsive to a projected image of an alignment mark on said patterning device.

35. The method of any of clauses 24 to 34 wherein said patterning device is arranged to apply a pattern to a radiation beam entering a projection system, an image of said patterning device being projected onto the substrate at said patterning location, and wherein said alignment sensor has a depth of focus more than ten, preferably more than a hundred times that of the projected image.

36. The method of any of clauses 24 to 35 measurement step includes a preliminary step of adjusting a position of said alignment sensor relative to the patterning location.

37. The method of clause 36 wherein said measurement step further includes locking the relative position of said alignment sensor after adjustment and prior to measurement.

38. The method of clause 36 or 37 wherein the position of said alignment sensor relative to the patterning location is adjusted by reference to recipe data received with a substrate to be patterned.

39. The method of clause 38 wherein the alignment sensor position is adjusted to coincide with scribe lane areas according to a die size specified in said recipe data.

40. The method of any of clauses 24 to 39 wherein operation of said alignment sensor comprises projecting a sensing beam of radiation onto said substrate and detecting a position of said mark in at least two-dimensions by measuring properties of said beam when reflected from the substrate during said relative motion.

41. The method of clause 40 wherein a position of said mark in three-dimensions is measured by measuring properties of a single radiation beam when reflected from the substrate.

42. The method of any of clauses 24 to 41 wherein a pattern from the patterning device is applied successively at an array of portions of said substrate, and said alignment sensors recognize and measure alignment marks in a first dimension on the substrate during a transit motion between successive substrate portions and to measure recognize and measure alignment marks in a second dimension during a scanning motion at one substrate portion.

43. The method of any of clauses 24 to 42 wherein measurements made at different times by the same alignment sensor from different alignment marks on the same substrate are combined statistically into a combined measurement result.

44. The method of any of clauses 24 to 43 wherein measurements made at different times by different alignment sensors from a single alignment mark are combined statistically into a combined measurement result.

45. The method of any of clauses 24 to 44 wherein measurements made at different times by the same alignment sensor from a single alignment mark are combined statistically into a combined measurement result.

46. A computer program product containing one or more sequences of machine-readable instructions for controlling a lithographic apparatus, the instructions being adapted for controlling the measurement and positioning steps of a method as described in any of clauses 24 to 45 above, in particular to cause one or more programmable processors of the apparatus to: (a) receive measurement signals from one or more alignment sensors during known relative movements of the alignment sensors and marks on a substrate; (b) process said measurement signals to establish the positions of portions of said substrate with a desired accuracy; and (c) to control the relative positioning of said substrate, a patterning device and a patterning subsystem of the apparatus so as to apply a pattern from said patterning device onto a desired portion of the substrate.

47. A method of transferring a pattern from a patterning device onto a substrate, the method comprising:
   providing a patterning subsystem for receiving said patterning device and applying said pattern to at least a portion of said substrate held at a patterning location;
   holding the substrate on a substrate support;
   measuring the locations of alignment marks on the substrate relative to the patterning device;
   using results of said measuring step to position said substrate support, said patterning subsystem and said patterning device relative to each other such that said pattern is applied a desired portion of the substrate, the location of said portion being defined accurately with respect to alignment marks present on the substrate; and
   processing said substrate to create product features in accordance with the applied pattern, wherein said measuring step is performed using a plurality of alignment sensors directed at locations on the substrate distributed around the patterning location, by operating said alignment sensors in the course of said sequence of movements to recognize and measure alignment marks on the substrate after applying the pattern to a first substrate portion to generate an updated measurement, and wherein said updated measurements are used in positioning said substrate support, said patterning subsystem and said patterning device relative to each other for the applying of said pattern to a subsequent substrate portion.

The invention claimed is:

1. A lithographic apparatus arranged to transfer a pattern from a patterning device onto a substrate, the apparatus comprising:
   a patterning subsystem constructed and arranged to receive said patterning device and to apply said pattern to a portion of said substrate held at a patterning location;
   a substrate support constructed and arranged to hold the substrate while said pattern is applied;
   at least one positioning subsystem constructed and arranged to move said substrate support, said patterning subsystem and said patterning device relative to each other in a sequence of movements such that said pattern is applied repeatedly at a plurality of desired portions of the substrate, the location of each portion being defined accurately with respect to alignment marks present on the substrate; and
   a measuring subsystem constructed and arranged to measure the locations of said alignment marks relative to the patterning device, and to supply measurement results to said positioning subsystem,
   wherein said measuring subsystem comprises one or more alignment sensors directed at the substrate, wherein each alignment sensor is operable in the course of said sequence of movements to recognize and measure alignment marks on the substrate to generate updated measurements, and wherein said positioning subsystem is operable to use said updated measurements in combination with previous measurements in positioning said substrate support, said patterning subsystem and said patterning device relative to each other for the applying of said pattern to a subsequent substrate portion.

2. The apparatus of claim 1 wherein the number of alignment sensors is at least three, the sensors being directed at sensing locations on the substrate distributed around the patterning location such that for any patterning location within a periphery of the substrate, at least one of said sensing locations is over a portion of the substrate.

3. The apparatus of claim 1 wherein said positioning subsystem and each alignment sensor is operable to recognize and measure alignment marks on the substrate during a transit motion between successive substrate portions.

4. The apparatus of claim 3 wherein said measurement subsystem is arranged to use measurement results obtained from an alignment mark during said transit motion in combination with measurement results from previous motions to control positioning in applying a pattern to a subsequent substrate portion.

5. The apparatus of claim 1 wherein said positioning subsystem is controlled to apply a pattern from the patterning device to each substrate portion progressively by a scanning motion, and wherein each alignment sensor is operable to recognize and measure alignment marks on the substrate during said scanning motion at one substrate portion.

6. The apparatus of claim 5 wherein said measurement subsystem is arranged to use measurement results obtained from an alignment mark during said scanning motion in combination with measurement results from previous motions to control positioning in applying a pattern to a subsequent substrate portion.

7. The apparatus of claim 1 wherein said one or more alignment sensor further includes a level sensing function operable during relative motion of the substrate and patterning subsystem under control of the positioning subsystem, the measurement subsystem recording height variation across the substrate surface as well as planar dimensions, the positioning subsystem controlling height and planar position of the applied pattern in accordance with said height variation.

8. The apparatus of claim 1 wherein said measuring subsystem comprises one or more level sensors operable in parallel with said alignment sensor during relative motion of the substrate and patterning subsystem under control of the positioning subsystem, the measurement subsystem recording height variation across the substrate surface as well as planar dimensions, the positioning subsystem controlling height and planar position of the applied pattern in accordance with said height variation.

9. The apparatus of claim 1 wherein said measurement subsystem further comprises one or more additional sensors for aligning a known position of said substrate support relative to alignment marks on said patterning device, the measurement sub-system combining said known position with said relative location measurements for said accurate positioning and patterning.

10. The apparatus of claim 9 wherein said measurement subsystem is arranged to use each additional sensor prior to patterning to measure at least two known positions on said substrate support relative to said alignment marks on the patterning device, and to use each alignment sensor to measure positions of alignment marks on the substrate relative to said known positions during transit between said two known positions.

11. The apparatus of claim 9 wherein said patterning device is arranged to apply said pattern to a radiation beam entering a projection system, an image of said patterning device being projected onto the substrate at said patterning location to apply the pattern to a substrate portion, and wherein each additional sensor comprises a pattern-specific radiation sensor responsive to a projected image of an alignment mark on said patterning device.

12. The apparatus of claim 1 wherein said patterning device is arranged to apply a pattern to a radiation beam entering a projection system, an image of said patterning device being projected onto the substrate at said patterning location, and wherein said alignment sensor has a depth of focus more than ten times that of the projected image.

13. The apparatus of claim 1 wherein said measurement subsystem includes an actuator for adjusting a position of said alignment sensor relative to the patterning location.

14. The apparatus of claim 13 wherein a controller of said measurement system is arranged to adjust the position of said alignment sensor by reference to recipe data received with a substrate to be patterned.

15. The apparatus of claim 1 wherein said alignment sensor comprises an optical system arranged to project a sensing beam of radiation onto said substrate and to detect a position of said mark in at least two-dimensions by measuring properties of said beam when diffracted by the substrate.

16. The apparatus of claim 1 wherein said measurement subsystem is arranged to make statistical combinations of measurements made at different times by the same alignment sensor from different alignment marks on the same substrate or wherein said measurement subsystem is arranged to make statistical combinations of measurements made at different times by different alignment sensors from a single alignment mark or wherein said measurement subsystem is arranged to make statistical combinations of measurements made at different times by the same alignment sensor from a single alignment mark.

* * * * *